United States Patent
Henderson et al.

(10) Patent No.: US 8,083,298 B2
(45) Date of Patent: Dec. 27, 2011

(54) RAIL KIT WITH UNIVERSAL MOUNTING CONNECTION BRACKETS

(75) Inventors: Gregory Henderson, Round Rock, TX (US); Riyad Moe, Temple, TX (US); Edmond I. Bailey, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 310 days.

(21) Appl. No.: 12/412,131

(22) Filed: Mar. 26, 2009

(65) Prior Publication Data
US 2010/0243586 A1 Sep. 30, 2010

(51) Int. Cl.
*A47B 81/00* (2006.01)
(52) U.S. Cl. .................. 312/223.1; 312/334.4; 211/26; 248/911
(58) Field of Classification Search .......... 211/26, 211/26.2, 189, 190, 192, 194, 162; 312/334.4, 312/334.5, 334.7, 223.1; 361/829, 825, 724; 361/726, 727; 248/558, 911, 912
See application file for complete search history.

(56) References Cited

U.S. PATENT DOCUMENTS

| | | | | |
|---|---|---|---|---|
| 3,133,768 A | * | 5/1964 | Klakovich | 384/17 |
| 3,716,284 A | * | 2/1973 | Vogt | 312/334.4 |
| 5,833,337 A | * | 11/1998 | Kofstad | 312/334.5 |
| 6,070,957 A | * | 6/2000 | Zachrai | 312/334.4 |
| 6,230,903 B1 | * | 5/2001 | Abbott | 211/26 |
| 6,655,534 B2 | * | 12/2003 | Williams et al. | 211/26 |
| 6,840,388 B2 | * | 1/2005 | Mayer | 211/26 |
| 2002/0158556 A1 | * | 10/2002 | Cheng | 312/333 |
| 2008/0296455 A1 | * | 12/2008 | Brock et al. | 248/298.1 |
| 2009/0309471 A1 | * | 12/2009 | Yu et al. | 312/334.44 |

OTHER PUBLICATIONS www.server-racks.com/hp-rails-threaded-hole-server-rack.html; "How to Install HP Rails in a Threaded Hole Server Rack"; pp. 4, Oct. 12, 2009.
www.server-racks.com/ibm-rail-kit-threaded-hole-rack.html; "Ho to Install IBM Slide Rails into a Threaded Hole Server Rack"; pp. 3, Oct. 12, 2009.
http://www.racksolutions.com/dell-poweredge-2450-2550-2650-rail-kit.shtml; Dell PowerEdge 2450 2550 2650 Rail Kit; pp. 2, Oct. 12, 2009.
http://www.racksolutions.com/hp/hp-compaq-2u-relay-rack-mount.shtml; HP-Compaq ProLiant Servers—Relay Rack Mount Kits; pp. 2, Oct. 12, 2009.
Hewlett-Packard Development Company, L.P.; Installation Instructions : HP Universal Rack Mount Kit for hp Carrier-Grade Servers cc2300, cc3300, and cc3310 (19-23 inch 2- and 4-Post Racks); pp. 16, Feb. 2004.

* cited by examiner

*Primary Examiner* — Korie Chan
(74) *Attorney, Agent, or Firm* — Baker Botts L.L.P.

(57) ABSTRACT

A rail system for supporting one or more information handling systems in both a four-post rack and a two-post rack includes a bracket support member, first and second toolless connection brackets coupled to the bracket support member, and first and second tooled connection brackets coupled to the bracket support member. The toolless connection brackets are configured to couple to first and second posts, respectively, of a four-post rack in a four-post toolless configuration. The tooled connection brackets are configured to couple to opposite sides of a post of a two-post rack in either a two-post flush-mounted or two-post center-mounted configuration.

16 Claims, 8 Drawing Sheets

RAIL KIT WITH UNIVERSAL MOUNTING CONNECTION BRACKETS

TECHNICAL FIELD

The present disclosure relates in general to information handling systems, and more particularly to a rail system for supporting an information handling system in both a four-post rack and a two-post rack.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems, as well as any infrastructure capable of supporting hardware and software components such as shelving.

Increasingly, information handling systems are deployed in systems that include multiple information handling systems arranged in racks and supported by rails, which may consolidate the physical space required to store, maintain and/or operate the information handling systems. However, rack and rail systems come in a variety of configurations. In traditional approaches, a separate rail configuration is required for each rack configuration, adding complexity to the process of configuring information handling systems.

SUMMARY

In accordance with certain embodiments of the present disclosure, a rail system for supporting one or more information handling systems in both a four-post rack and a two-post rack includes a bracket support member, first and second toolless connection brackets coupled to the bracket support member, and first and second tooled connection brackets coupled to the bracket support member. The toolless connection brackets are configured to couple to first and second posts, respectively, of a four-post rack in a four-post toolless configuration. The tooled connection brackets are configured to couple to opposite sides of a post of a two-post rack in either a two-post flush-mounted or two-post center-mounted configuration.

In accordance with certain embodiments of the present disclosure, a system comprising a rack, a plurality of information handling systems, and a rail configured to support one or more of the information handling systems. The rail includes a bracket support member, first and second toolless connection brackets coupled to the bracket support member, and first and second tooled connection brackets coupled to the bracket support member. The toolless connection brackets are configured to couple to first and second posts, respectively, of a four-post rack in a four-post toolless configuration. The tooled connection brackets are configured to couple to opposite sides of a post of a two-post rack in either a two-post flush-mounted or two-post center-mounted configuration.

In accordance with certain embodiments of the present disclosure, a rail configured to support an information handling system in both a four-post rack and a two-post rack. The rail includes a bracket support member, and first and second bracket base members. Each bracket base member is adjustably coupled to the bracket support member and carries at least one bracket. The bracket base members are adjustable relative to the bracket support member such that the rail is capable of supporting the information handling system in a two-post flush-mounted, two-post center-mounted, and a four-post toolless configuration.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1A through 4B, wherein like numbers are used to indicate like and corresponding parts.

For the purposes of this disclosure, an information handling system ("IHS") may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components. The information handling system may also include the infrastructure capable of supporting those hardware and software components, e.g., shelving.

FIGS. 1A-4B illustrate example embodiments of a rail 100 configured to support an IHS in four-post tooled, four-post toolless, two-post center-mounted, and two-post flush-mounted configurations. In these example embodiments, rail 100 may be of sufficient length to support an IHS with a mounting depth of up to 30 inches. However, rail 100 may be of any length necessary to support an IHS. Rail 100 may be made of sheet metal, aluminum, plastic, any suitably rigid material capable of supporting a portion of an IHS, or any suitable combination thereof.

Rail 100 may include at least two tooled connection brackets and at least two toolless connection brackets coupled to a bracket support member. For ease of description, connection brackets may be labeled "first," "second," "third," or "fourth." These labels are for clarity of description only, and do not limit the nature or operation of connection brackets.

Figure 1A:
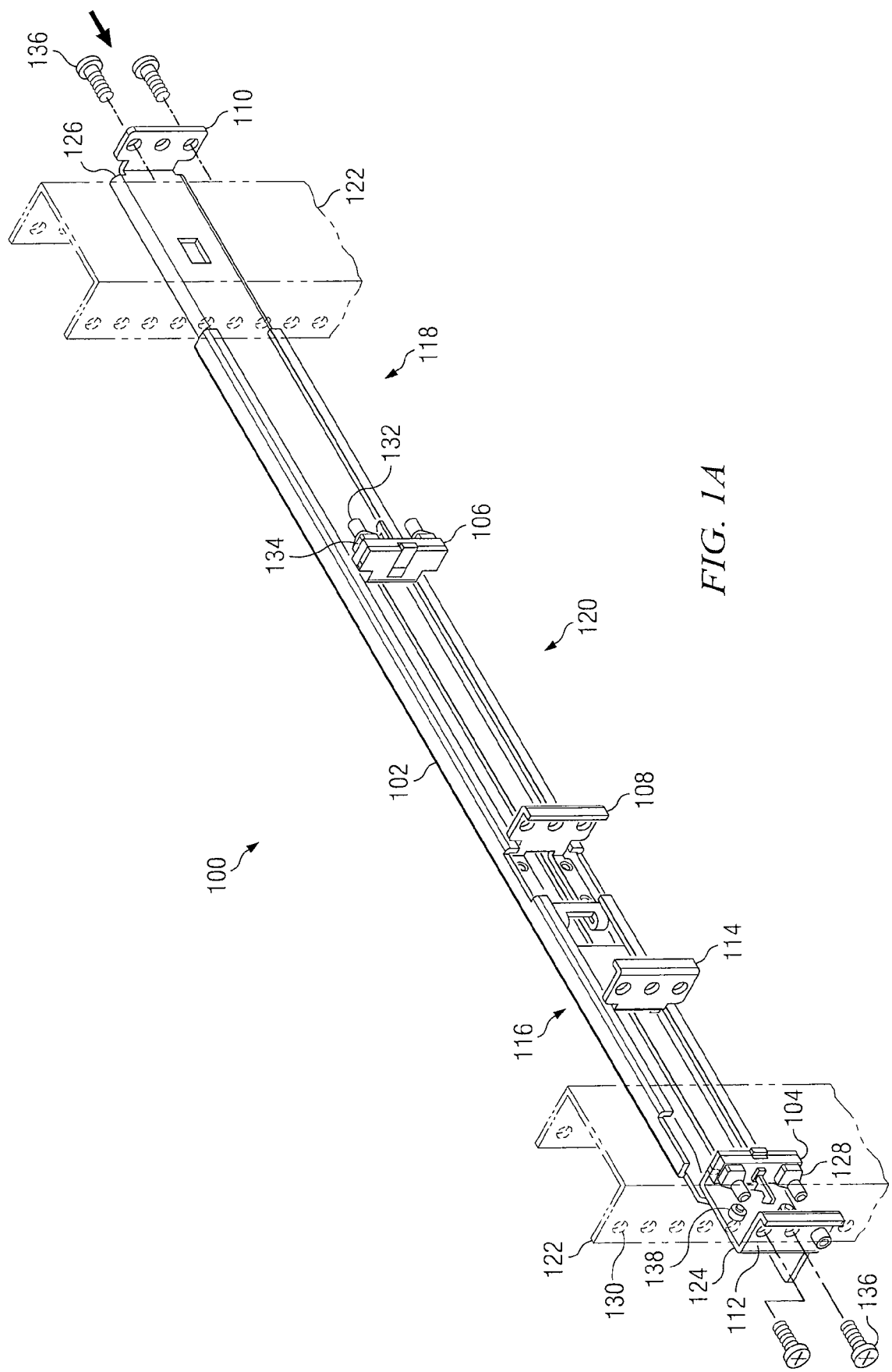
FIG. 1A illustrates a rail for supporting an information handling system in a four-post tooled configuration, in accordance with certain embodiments of the present disclosure.

FIG. 1A illustrates a rail 100 for supporting an information handling system in a four-post tooled configuration, according to certain embodiments of the present disclosure.

Rail 100 may include a bracket support member 102, a first tooled connection bracket 110 coupled to bracket support member 102, and a second tooled connection bracket 112 coupled to bracket support member 102. First and second tooled connection brackets 110, 112 may be configured to couple to a first post and second post 122 of a four-post rack via a post connector 136, in order to support an IHS in a four-post tooled configuration. Post connector(s) 136 may be any tooled fastener capable of coupling first or second tooled connection brackets 110, 112 to post 122, e.g., a screw or bolt.

In some embodiments, rail 100 may also include a first toolless connection bracket 106 coupled to bracket support member 102, a second toolless connection bracket 104 coupled to bracket support member 102, a third tooled connection bracket 108 coupled to bracket support member 102, and a fourth tooled connection bracket 114 coupled to bracket support member 102. In this example embodiment, first and second toolless connection brackets 106, 104, and third and fourth tooled connection brackets 108, 114 are not connected to post(s) 122. These connection brackets may be used to support an information handling system in other configurations, as described in more detail below with reference to FIGS. 2A-4B.

First, second, third, and fourth tooled connection brackets 110, 112, 108, 114 may each include at least one opening capable of receiving a tooled connector, e.g., a screw or a bolt.

In some embodiments, first and second toolless connection brackets may each include at least one projection 128 capable of insertion into either a rounded or a substantially rectangular opening. Each projection 128 may include a first portion with a rounded cross-section 132 and a second portion with a substantially rectangular cross-section 134, such that the projection(s) may be configured to be received in both a rounded opening and a substantially rectangular opening.

In some embodiments, rail 100 may also include a rear bracket base 126 adjustably coupled to bracket support member 102. Rear bracket base 126 may carry first tooled connection bracket 110 and first toolless connection bracket 106. Additionally, rear bracket base 126 may slidably adjust relative to bracket support member 102 such that the distance between first tooled connection bracket 110 and second tooled connection bracket 112 may be variable. By varying the distance between the first and second tooled connection brackets 110, 112, rail 100 may couple to posts 122 of varying separation distances. For instance, posts 122 may be placed 24 inches apart or 36 inches apart, depending on the configuration of a particular rack.

Rear bracket base 126 may also be adjustably coupled to bracket support member 102 such that rear bracket base 126 may be positioned in either a first position or a second position. In this example embodiment, rear bracket base 126 is in the first position, wherein first tooled connection bracket 110 is proximate to rear portion 118 of rail 100, in order to support the IHS in a four-post tooled configuration.

Figure 2A:
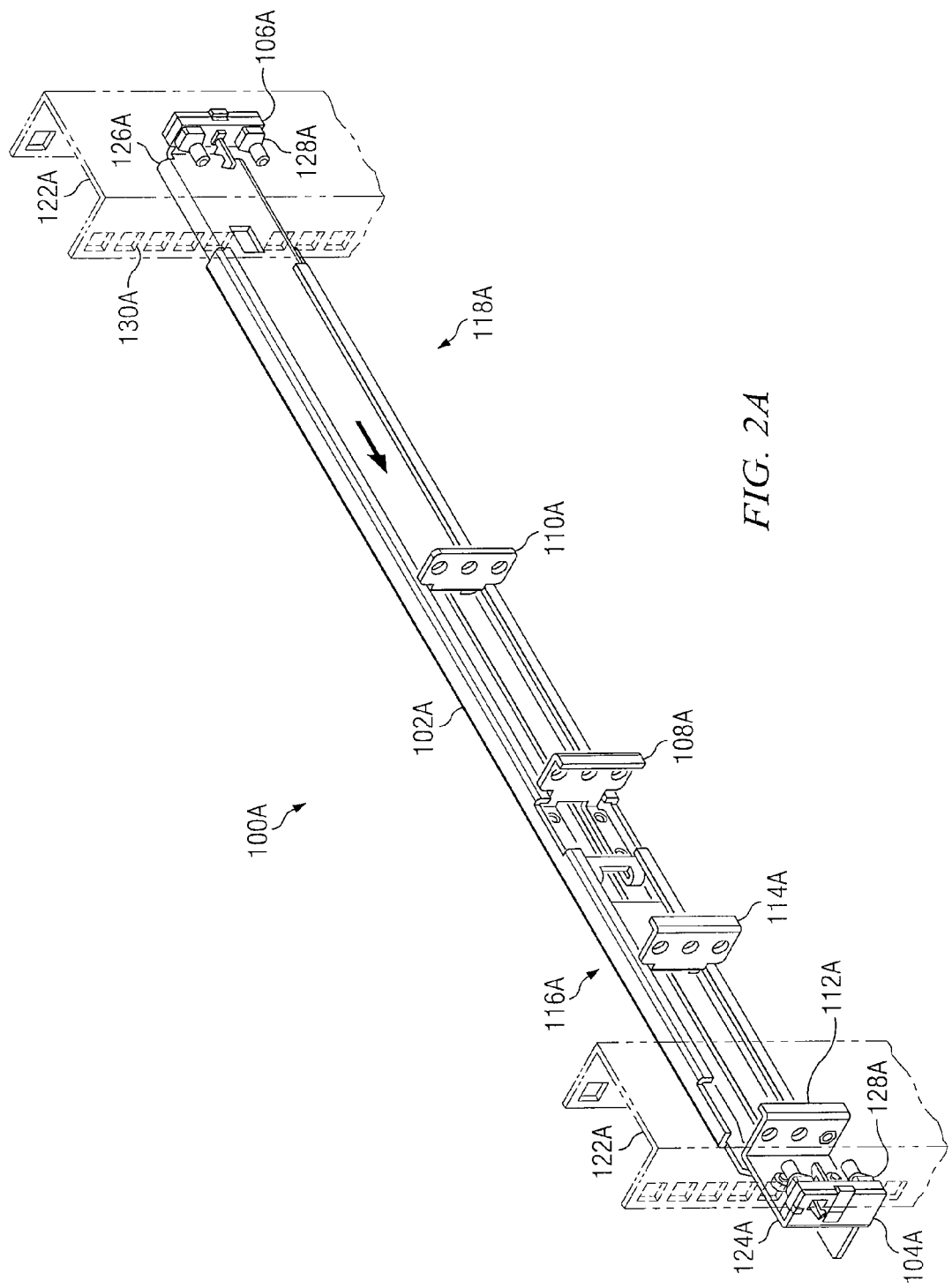
FIG. 2A illustrates a rail for supporting an information handling system in a four-post toolless configuration, in accordance with certain embodiments of the present disclosure.

As described in more detail below with reference to FIGS. 2A and 2B, rear bracket base 126 may also be removed from bracket support member 102 and recoupled to bracket support member 102 in a second position, wherein first toolless connection bracket 106 is proximate to a rear portion 118 of rail 100 in order to support an information handling system in a four-post toolless configuration. For example, as shown in FIG. 2A, rear bracket base 126 may slide wholly out of contact with bracket support member 102, rotated 180 degrees relative to bracket support member 102, and reconnected to bracket support member 102. However, rear bracket base 126 may be adjustably coupled to bracket support member 102 in any manner that allows rear bracket base 126 to be coupled to bracket support member 102 in either a first position or a second position.

In some embodiments, rail 100 may also include front bracket base 124 adjustably coupled to bracket support member 102. Front bracket base 124 may carry second tooled connection bracket 112 and second toolless connection bracket 104. Front bracket base 124 may be adjustably coupled to bracket support member 102 such that front bracket base 124 may be positioned in either a first position or a second position. In this example embodiment, front bracket base 124 is in the first position, wherein second tooled connection bracket 112 is proximate to a front portion 116 of rail 100.

As described in more detail below with reference to FIGS. 2A and 2B, front bracket base 124 may also be removed from bracket support member 102 and recoupled to bracket support member 102 in a second position, wherein second toolless connection bracket 104 is proximate to a front portion 116 of rail 100 in order to support an information handling system in a four-post toolless configuration. For example, as depicted in FIG. 2A, front bracket base 124 may be coupled to bracket support member 102 by a screw 138. Screw 138 may be removed, front bracket base 124 rotated 180 degrees relative to bracket support member 102, and front bracket base 124 reconnected to bracket support member 102 via screw 138. However, front bracket base 124 may be adjustably coupled to bracket support member 102 in any manner that allows front bracket base 124 to couple to bracket support member 102 in either a first position or a second position.

Figure 1B:
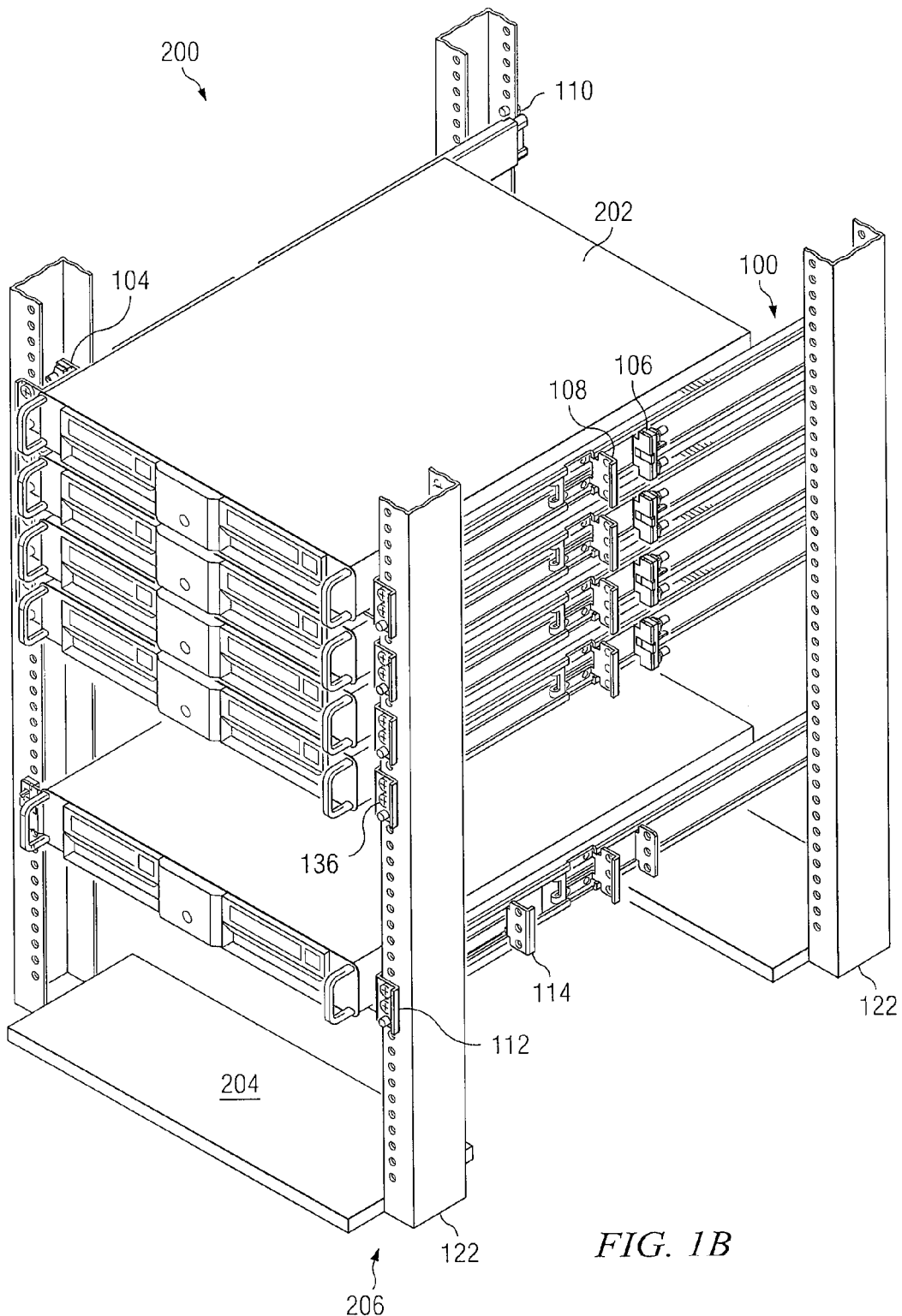
FIG. 1B illustrates a system for supporting one or more information handling systems in a four-post tooled configuration, in accordance with certain embodiments of the present disclosure.

Turning again to the example embodiment depicted in FIGS. 1A-1B, rail 100 may be configured to coupled to posts 122 of a four-post rack in a tooled configuration. As described in more detail below with reference to FIGS. 2A-4B, combinations of the described connection brackets may also be used to support an information handling system in four-post toolless, two-post flush-mounted, and two-post center-mounted configurations.

FIG. 1B illustrates a system 200 for supporting one or more IHSs 202 in a four-post tooled configuration, according to certain embodiments of the present disclosure. System 200 may includes a rack 206 and one or more pairs of rails 100. Rack 206 may, in some embodiments, be a framework with a base 204, posts 122, and a cap, capable of housing or supporting multiple IHSs 202. In some embodiments, rack 206 may be a four-post 19-inch wide rack capable of housing up to 42 rack units, each rack unit approximately 1.75 inches tall, such as that described by standard EIA-310-D, promulgated by the Electronic Industries Association. However, in other embodiments, rack 206 may include one or more walls, may include a door, may have different dimensions (e.g., a 23-inch wide rack), may be configured to house or support a different number of rack units, or may be a custom enclosure with non-standard dimensions. Additionally, rack 206 may have a different number of posts (e.g., two), as described in more detail below with reference to FIGS. 3A-4B.

In some embodiments, one or both of a pair of rails 100 may be configured to support an IHS. Each rail 100 may couple to one or more post(s) 122 in order to support an IHS 202. In some embodiments, a pair of rails 100 may support a single IHS 202 (e.g., a server), or may support multiple IHSs 202 (e.g., certain digital video equipment that requires less than the full width of rack 206). In some embodiments, post (s) 122 may have threaded, rounded openings with opening spacing repeating at ½-inch, ⅝-inch, and ⅝-inch intervals, such as that described by standard EIA-310-D, promulgated by the Electronic Industries Association. However, in other embodiments, post(s) 122 may be any post appropriately configured to couple to rail 100 via any appropriate tooled connector.

Each rail 100 may include first and second tooled connection brackets 110, 112 coupled to posts 122 of rack 206 via connector(s) 136. In the example embodiment, posts 122 may have threaded openings capable of receiving post connector (s) 136, which may be a screw, bolt, or any other suitable tooled connector.

As described above, rail 100 may also include first and second toolless connection brackets 104, 106, and third and fourth tooled connection brackets 108, 114, which may allow rail 100 to be configured to support a portion of an IHS 202 in a four-post toolless, two-post center-mounted, or two-post flush-mounted configuration, as described in greater detail below with reference to FIGS. 2A-4B.

FIG. 2A illustrates a rail 100A for supporting an information handling system in a four-post toolless configuration, according to certain embodiments of the present disclosure. Rail 100A may include a bracket support member 102A, a first toolless connection bracket 106A coupled to bracket support member 102A, and a second toolless connection bracket 104A coupled to bracket support member 102A. First and second toolless connection brackets 106A, 104A may be configured to couple to a post 122A via one or more projection(s) 128A.

In some embodiments, rail 100A may also include a first tooled connection bracket 110A coupled to bracket support member 102A, a second toolless connection bracket 112A coupled to bracket support member 102A, a third tooled connection bracket 108A coupled to bracket support member 102A, and a fourth tooled connection bracket 114A coupled to bracket support member 102A. In this example embodiment, first and second tooled connection brackets 110A, 112A, and third and fourth tooled connection brackets 108A, 114A may not be coupled to post(s) 122A. These connection brackets may be used to support an information handling system in other configurations, as described in more detail above with reference to FIGS. 1A-1B, and below with reference to FIGS. 3A-4B.

In some embodiments, rail 100A may also include a rear bracket base 126A adjustably coupled to bracket support member 102A. Rear bracket base 126A may carry first tooled connection bracket 110A and first toolless connection bracket 106A. Additionally, rear bracket base 126A may slidably adjust relative to bracket support member 102A such that the distance between first toolless connection bracket 104A and second toolless connection bracket 106A may be variable. By varying the distance between the first and second toolless connection brackets 104, 106, rail 100A may couple to posts 122A of varying separation distances. For instance, posts 122A may be placed 24 inches apart or 36 inches apart, depending on the configuration of a particular rack.

Rear bracket base 126A may also be adjustably coupled to bracket support member 102A such that rear bracket base 126A may be positioned in either a first position or a second position. In this example embodiment, rear bracket base 126A is in the second position, wherein first toolless connection bracket 106A is proximate to rear portion 118A of rail 100A, in order to support the IHS in a four-post toolless configuration.

As described in more detail above in FIGS. 1A and 1B, rear bracket base 126A may also be removed from bracket support member 102A and recoupled to bracket support member 102A in a first position, wherein first tooled connection bracket 110A is proximate to a rear portion 118A of rail 100A in order to support an information handling system in a four-post tooled configuration.

In some embodiments, rail 100A may also include front bracket base 124A adjustably coupled to bracket support member 102A. Front bracket base 124A may carry second tooled connection bracket 112A and second toolless connection bracket 104A. Front bracket base 124A may be adjustably coupled to bracket support member 102A such that front bracket base 124A may be positioned in either a first position or a second position. In the present embodiment, front bracket base 124A is in the second position, wherein second toolless connection bracket 104A is proximate to a front portion 116A of rail 100A.

As described in more detail above with reference to FIGS. 1A and 1B, front bracket base 124A may also be removed from bracket support member 102A and recoupled to bracket support member 102A in a first position, wherein second tooled connection bracket 112A is proximate to a front portion 116A of rail 100A in order to support an information handling system in a four-post tooled configuration.

Figure 2B:
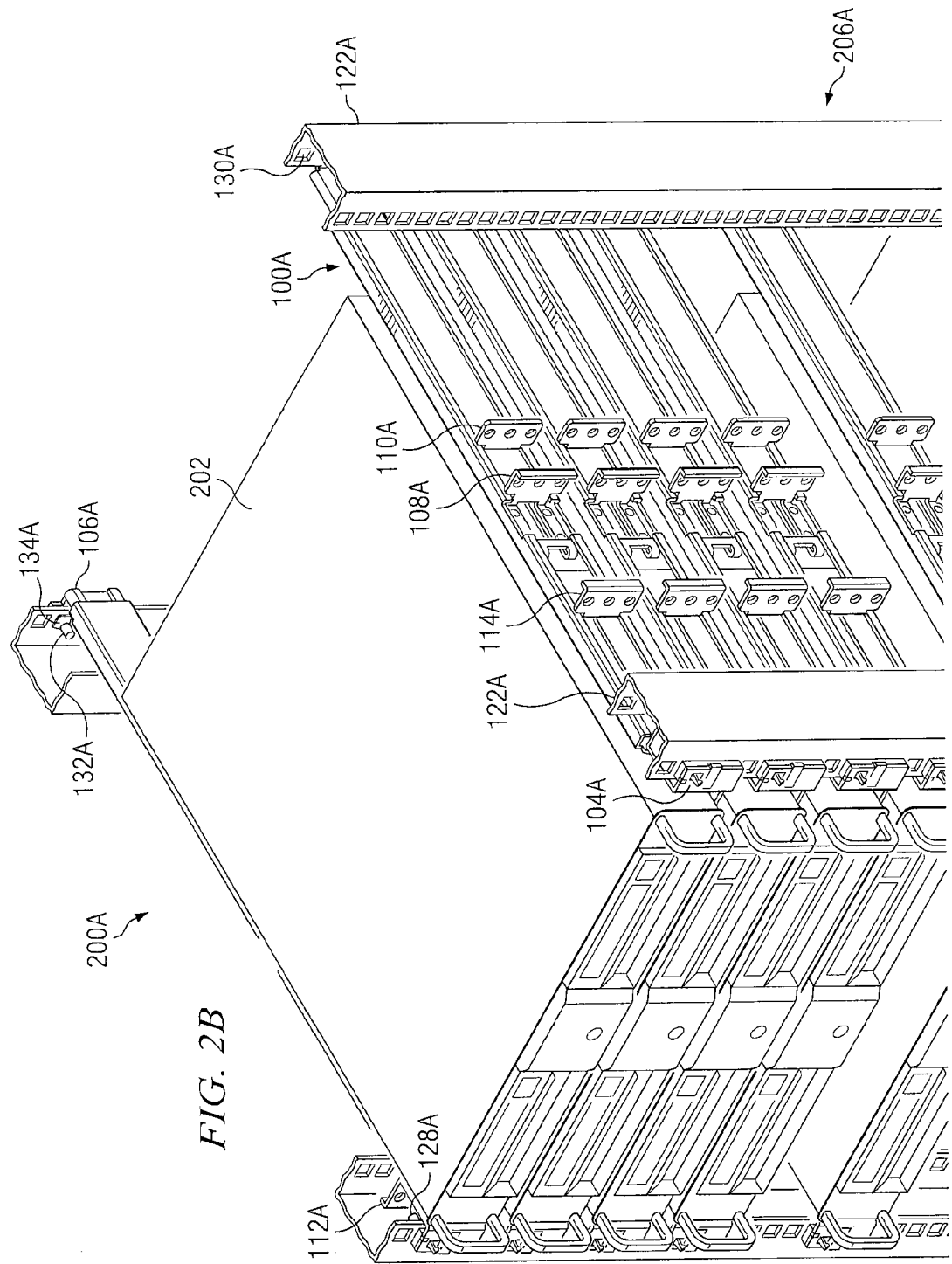
FIG. 2B illustrates a system for supporting one or more information handling systems in a four-post toolless configuration, in accordance with certain embodiments of the present disclosure.

Turning again to the example embodiment depicted in FIGS. 2A-2B, rail 100A may be configured to couple to posts 122A of a four-post rack in a toolless configuration. As described in more detail above with reference to FIGS. 1A-1B and below with reference to FIGS. 3A-4B, combinations of the described connection brackets may also be used to support an information handling system in four-post tooled, two-post flush-mounted, and two-post center-mounted configurations.

FIG. 2B illustrates a system 200A for supporting one or more IHSs 202 in a four-post toolless configuration, according to certain embodiments of the present disclosure. System 200A may include a rack 206A and one or more pairs of rails 100A.

Each rail 100A may include first and second toolless connection brackets 106A, 104A coupled to posts 122A of rack 206A via projections 128A. In this example embodiment, posts 122A may have square openings 130A. In other embodiments, posts 122A may have rounded or substantially rectangular openings. Projection(s) 128A may include a first portion with rounded cross-section 132A and a second portion with substantially rectangular cross-section 134A. Projection(s) 128A may be inserted into square opening(s) 130A until second portion(s) with substantially rectangular cross-section 134A sufficiently couples to opening(s) 130A in order to support an IHS in a four-post toolless configuration.

This toolless method of coupling rail 100A to rack 206A via a toolless connection bracket may simplify the rack 206A setup process and reduces the user's need to keep track of a number of parts and tools.

As described above, rail 100A may also include first and second tooled connection brackets 110A, 112A, and third and fourth tooled connection brackets 108A, 114A, which may allow rail 100A to be configured to support a portion of an IHS 202 in a four-post tooled, two-post center-mounted, or two-post flush-mounted configuration, as described in greater detail above with reference to FIGS. 1A-1B and below with reference to FIGS. 2A-4B.

Figure 3A:
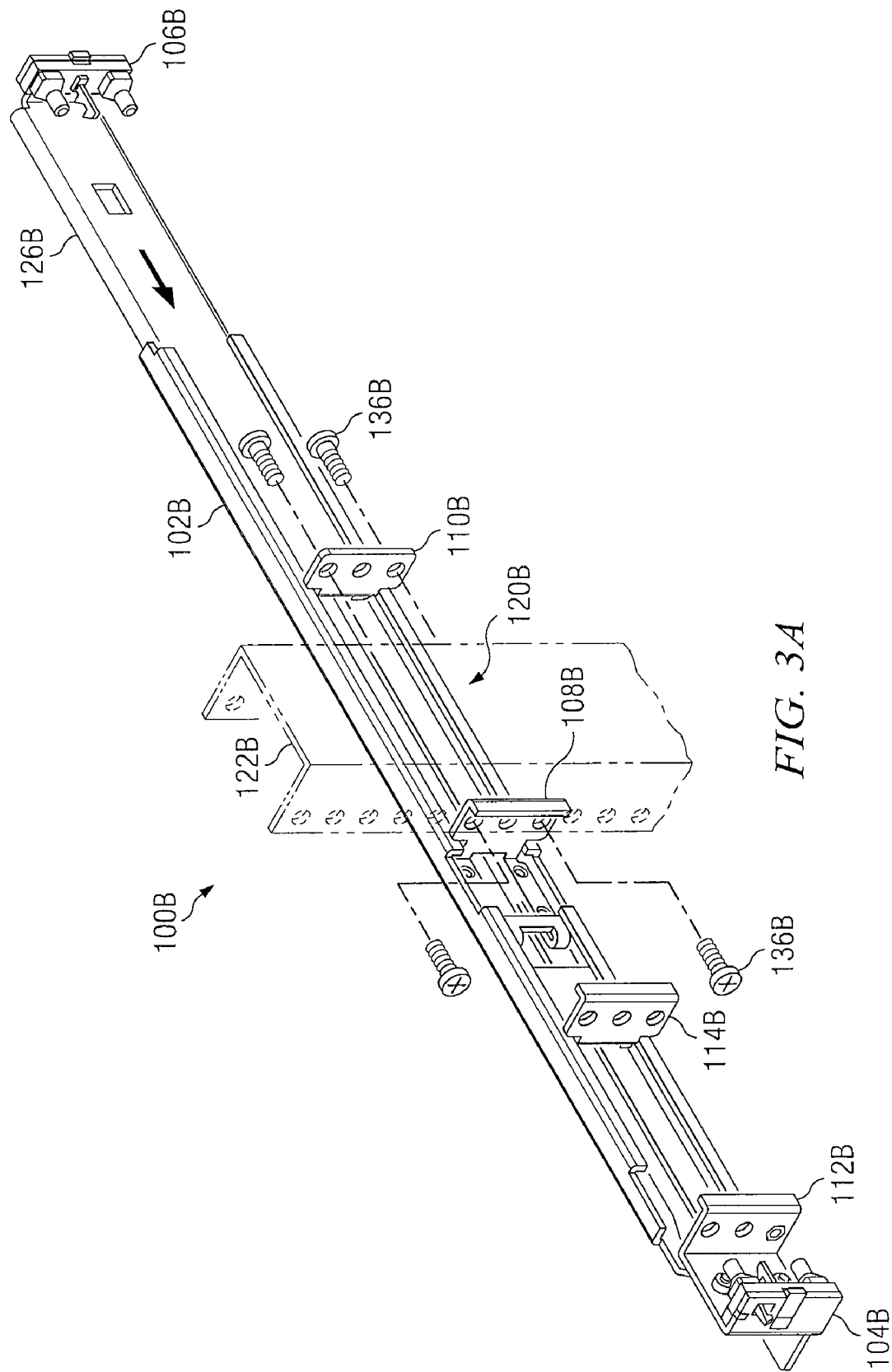
FIG. 3A illustrates a rail for supporting an information handling system in a two-post center-mounted configuration, in accordance with certain embodiments of the present disclosure.

FIG. 3A illustrates a rail 100B for supporting an information handling system in a two-post center-mounted configuration, according to certain embodiments of the present disclosure.

Rail 100B may include a first tooled connection bracket 110B coupled to bracket support member 102B and a third tooled connection bracket 108B coupled to bracket support member 102B. First and third tooled connection brackets 110B, 108B may be configured to connect to opposite sides of post 122B of a two-post rack via connector 136B, in order to support an IHS in a two-post center-mounted configuration. Connector(s) 136B may be any tooled fastener capable of coupling first or third tooled connection brackets 110B, 108B to post 122B, e.g., a screw or bolt.

In some embodiments, rail 100B may also may include a first toolless connection bracket 106B coupled to bracket support member 102B, a second toolless connection bracket 104B coupled to bracket support member 102B, a second tooled connection bracket 112B coupled to bracket support member 102B, and a fourth tooled connection bracket 114B coupled to bracket support member 102B. In this example embodiment, first and second toolless connection brackets 106B, 104B, and second and fourth tooled connection brackets 112B, 114B may not be coupled to post(s) 122. These connection brackets may be used to support an information handling system in other configurations, as described in more detail above with reference to FIGS. 1A-2B, and below with reference to FIGS. 4A-4B.

In some embodiments, rail 100B may also include a rear bracket base 126B adjustably coupled to bracket support member 102B. Rear bracket base 126B may carry first tooled connection bracket 110B and first toolless connection bracket 106B. Additionally, rear bracket base 126B may slidably adjust relative to bracket support member 102B such that the distance between first tooled connection bracket 110B and third tooled connection bracket 108B may be variable. By varying the distance between the first and third tooled connection brackets 110B, 108B, rail 100B may couple to posts 122B of varying widths. For instance, post 122B may be six inches wide, or any other standard or non-standard width.

Figure 3B:
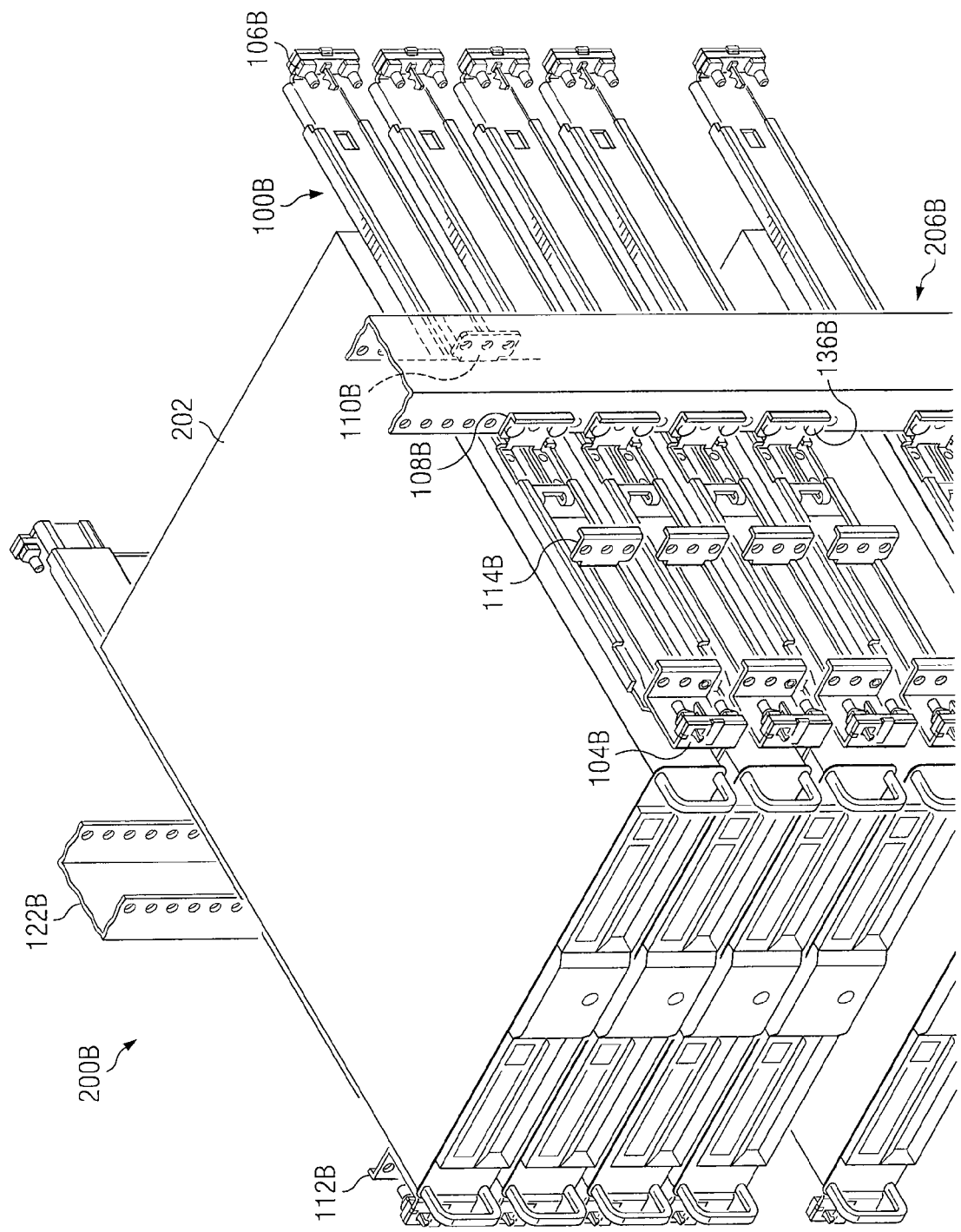
FIG. 3B illustrates a system for supporting one or more information handling systems in a two-post center-mounted configuration, in accordance with certain embodiments of the present disclosure.

Turning again to the example embodiment depicted in FIGS. 3A-3B, rail 100B may be configured to couple to posts 122B of a two-post rack in a center-mount configuration. As described in more detail above with reference to FIGS. 1A-2B and below with reference to FIGS. 4A-4B, combinations of the various connection brackets may also be used to support an information handling system in four-post tooled, four-post toolless, and two-post flush-mounted configurations.

FIG. 3B illustrates a system 200B for supporting one or more IHSs 202 in a two-post center-mount configuration, according to certain embodiments of the present disclosure. System 200B may include a rack 206B and one or more pairs of rails 100B.

Each rail 100B may include first and third tooled connection brackets 110B, 108B coupled to posts 122B of rack 206B via connector(s) 136B. In the example embodiment, posts 122B may have threaded openings capable of receiving post connector(s) 136B, which may be a screw, bolt, or any other suitable tooled connector.

As described above, rail 100B may also include first and second toolless connection brackets 104B, 106B, and second and fourth tooled connection brackets 112B, 114B, which may allow rail 100B to be configured to support a portion of an IHS 202 in a four-post toolless, four-post tooled, or two-post flush-mounted configuration, as described in greater detail above with reference to FIGS. 1A-2B and below with reference to FIGS. 4A-4B.

Figure 4A:
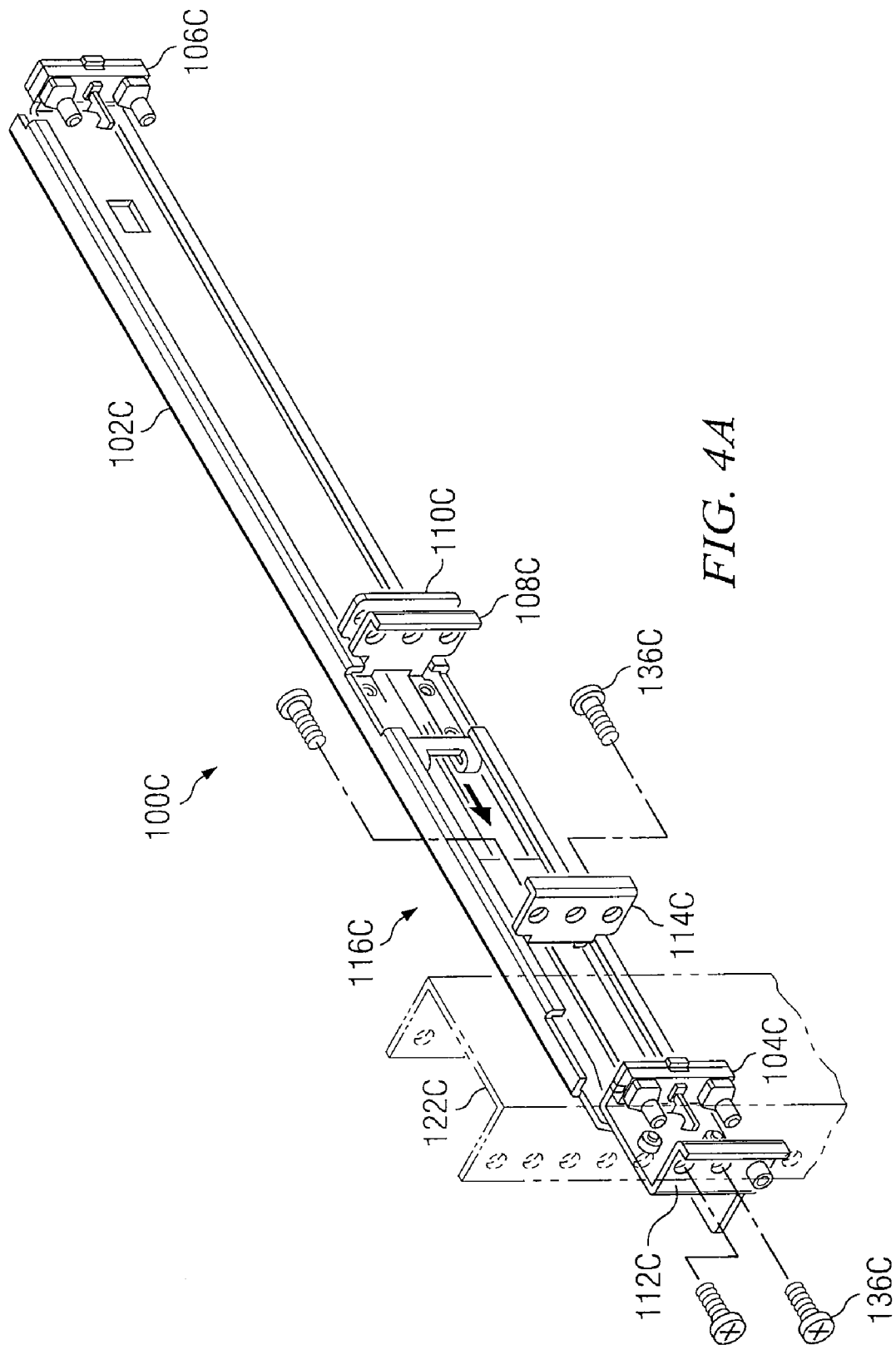
FIG. 4A illustrates a rail for supporting an information handling system in a two-post flush-mounted configuration, in accordance with certain embodiments of the present disclosure.

FIG. 4A illustrates a rail 100C for supporting an information handling system in a two-post flush-mounted configuration, according to certain embodiments of the present disclosure.

Rail 100C may include a bracket support member 102C, a second tooled connection bracket 112C coupled to bracket support member 102C, and a fourth tooled connection bracket 114C coupled to bracket support member 102C. Second and fourth tooled connection brackets 112C, 114C may be configured to couple to opposite sides of post 122C of a two-post rack via connector 136C, in order to support an IHS in a two-post flush-mounted configuration. Connector(s) 136C may be any tooled fastener capable of coupling second or fourth tooled connection brackets 112C, 114C to post 122C, e.g., a screw or bolt.

In some embodiments, rail 100C may also may include a first toolless connection bracket 106B coupled to bracket support member 102C, a second toolless connection bracket 104B coupled to bracket support member 102C, a first tooled connection bracket 110C coupled to bracket support member 102C, and a third tooled connection bracket 108C coupled to bracket support member 102C. In this example embodiment, first and second toolless connection brackets 106B, 104B, and first and third tooled connection brackets 110C, 108C may not be coupled to post(s) 122C. These connection brackets may be used to support an information handling system in other configurations, as described in more detail above with reference to FIGS. 1A-3B.

In some embodiments, fourth tooled connection bracket 114C may slidably adjust relative to bracket support member 102C such that the distance between second tooled connection bracket 112C and fourth tooled connection bracket 114C may be variable. By varying the distance between the second and fourth tooled connection brackets 112C, 114C, rail 100C may couple to posts 122C of varying widths. For instance, post 122C may be six inches wide, or any other standard or non-standard width.

Rail 100C may be configured to couple to posts 122C of a two-post rack in a flush-mount configuration. As described in more detail above with reference to FIGS. 1A-3B, combinations of the various connection brackets may also be used to support an information handling system in four-post tooled, four-post toolless, and two-post center-mounted configurations.

Figure 4B:
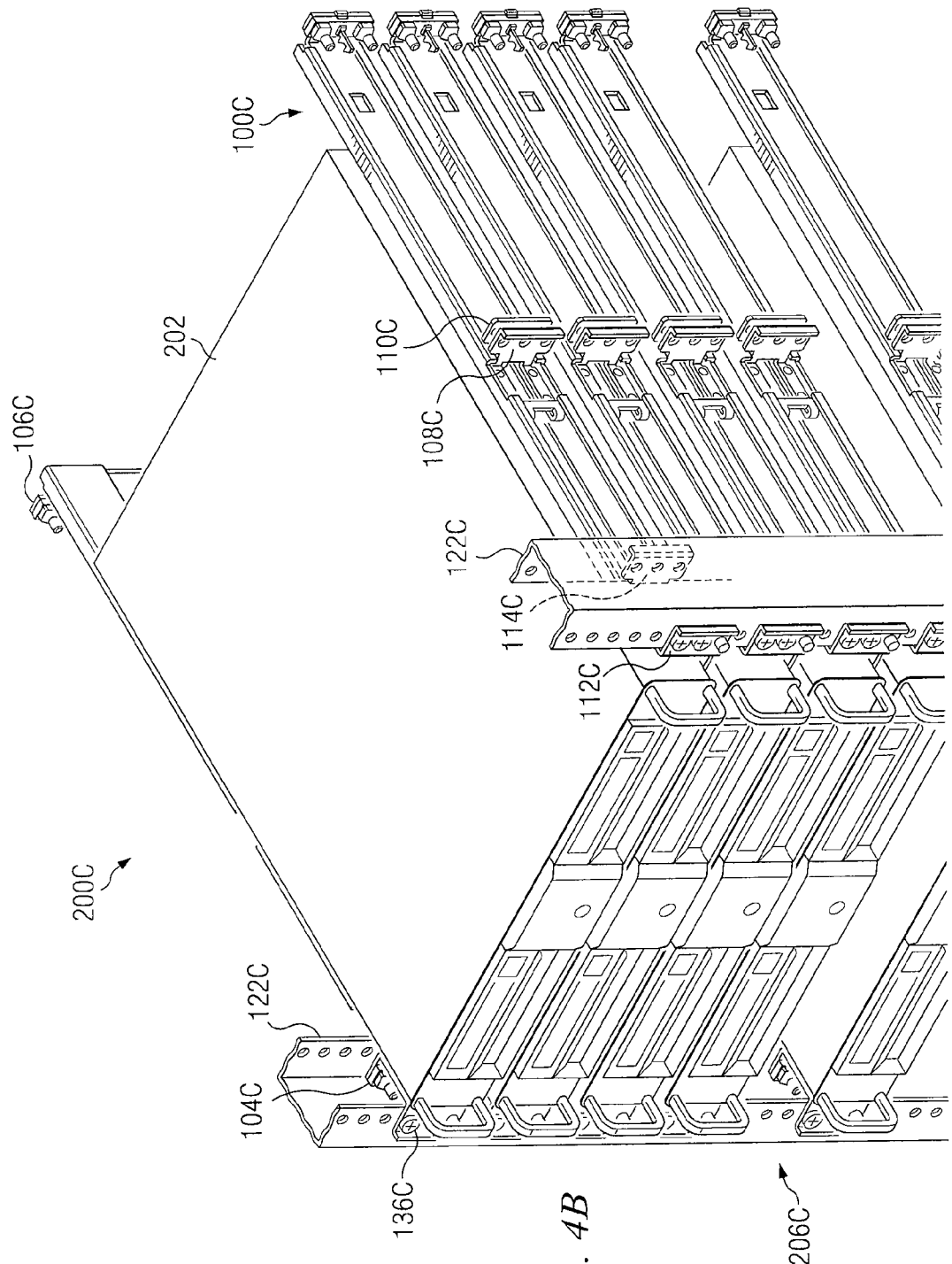
FIG. 4B illustrates a system for supporting one or more information handling systems in a two-post flush-mounted configuration, in accordance with certain embodiments of the present disclosure.

FIG. 4B illustrates a system 200C for supporting one or more IHSs 202 in a two-post flush-mount configuration, according to certain embodiments of the present disclosure. System 200C may include a rack 206C and one or more pairs of rails 100C.

Each rail 100C may include second and fourth tooled connection brackets 112C, 114C coupled to posts 122C of rack 206C via connector(s) 136C. In the example embodiment, post 122C may have threaded openings capable of receiving post connector(s) 136C, which may be a screw, bolt, or any other suitable tooled connector.

As described above, rail 100C may also include first and second toolless connection brackets 104C, 106C, and first and third tooled connection brackets 110C, 108C, which may allow rail 100C to be configured to support a portion of an IHS 202 in a four-post toolless, four-post tooled, or two-post center-mounted configuration, as described in greater detail above with reference to FIGS. 1A-3B.

Although the present disclosure has been described in detail, it should be understood that various changes, substitutions, and alterations can be made hereto without departing from the spirit and the scope of the disclosure as defined by the appended claims.

What is claimed is:

1. A rail system for supporting an information handling system, comprising:
   a rail configured to support an information handling system, the rail including:
      a bracket support member;
      first and second toolless connection brackets coupled to the bracket support member; and
      first and second tooled connection brackets coupled to the bracket support member, wherein:
         the first and second toolless connection brackets are configured to couple to first and second posts, respectively, of a four-post rack in order to support the information handling system in a four-post toolless configuration; and
         the first and second tooled connection brackets are configured to couple to opposite sides of a post of a two-post rack in order to support the information handling system in a two-post tooled configuration; and
      a rear bracket base adjustably coupled to the bracket support member, the rear bracket base including the second toolless connection bracket and the second tooled connection bracket and configured to be adjustably positioned in either a first rear bracket brace position or a second rear bracket brace position, wherein:
         in the first rear bracket brace position, the second tooled connection bracket is proximate to a rear portion of the bracket support member in order to support the information handling system in a tooled configuration;
         in the second rear bracket brace position, the second toolless connection bracket is proximate to the rear portion of the bracket support member in order to support the information handling system in a toolless configuration; and
         in both the first and second rear bracket brace positions, the rear bracket base is slidably adjustable relative to the bracket support member.

2. The rail system of claim 1, wherein in the second rear bracket brace position the second tooled connection bracket is proximate to a center portion of the bracket support member in order to support the information handling system in a two-post center-mounted configuration.

3. The rail system of claim 1, wherein at least one of the first and second toolless connection brackets is adjustably coupled to the bracket support member, such that the distance between the first and second toolless connection brackets is variable.

4. The rail system of claim 1, wherein at least one of the first and second tooled connection brackets is adjustably coupled to the bracket support member, such that the distance between the first and second tooled connection brackets is variable.

5. The rail system of claim 1, further comprising a front bracket base adjustably coupled to the bracket support member, the front bracket base including the first toolless connection bracket and the first tooled connection bracket and configured to be adjustably positioned in either a first front bracket brace position or a second front bracket brace position, wherein:
   in the first front bracket brace position, the first tooled connection bracket is proximate to a front portion of the bracket support member in order to support the information handling system in a tooled configuration;
   in the second front bracket brace position, the first toolless connection bracket is proximate to the front portion of the bracket support member in order to support the information handling system in a toolless configuration; and
   the second front bracket brace position is rotated 180 degrees from the first front bracket brace position relative to the bracket support member.

6. The rail system of claim 1, further comprising:
   a third tooled connection bracket adjustably coupled to the bracket support member; and
   a fourth tooled connection bracket coupled to the bracket support member, wherein:
      the third and fourth tooled connection brackets are configured to couple to opposite sides of a post of a two-post rack; and
      the rail is adjustable to position the third and fourth tooled connection brackets proximate to a center portion of the bracket support member in order to support the information handling system in a two-post center-mounted tooled configuration.

7. The rail system of claim 1, further comprising a third tooled connection bracket adjustably coupled to the bracket support member, wherein:
   the third tooled connection bracket and an at least one of the first and second tooled connection brackets are configured to couple to opposite sides of a post of a two-post rack; and
   the rail is adjustable to position the third tooled connection bracket and the at least one of the first and second tooled connection brackets proximat to a front portion of the bracket support member in order to support the information handling system in a two-pos-flush-mounted tooled configuration.

8. The rail system of claim 1, wherein the first toolless connection bracket comprises at least two projections for projecting into at least two openings of a rack post, each projection comprising:

a first portion with a rounded cross-section; and
a second portion with a substantially rectangular cross-section, such that the projection is configured to be received in both a rounded opening and a substantially rectangular opening.

9. A system, comprising:
a rack;
one or more information handling systems; and
a rail configured to support an information handling system, the rail including:
  a bracket support member;
  first and second toolless connection brackets coupled to the bracket support member; and
  first and second tooled connection brackets coupled to the bracket support member, wherein:
    the first and second toolless connection brackets are configured to couple to first and second posts, respectively, of a four-post rack in order to support the information handling system in a four-post toolless configuration; and
    the first and second tooled connection brackets are configured to couple to opposite sides of a post of a two-post rack in order to support the information handling system in a two-post tooled configuration; and
  a rear bracket base adjustably coupled to the bracket support member, the rear bracket base including the second toolless connection bracket and the second tooled connection bracket and configured to be adjustably positioned in either a first rear bracket brace position or a second rear bracket brace position, wherein:
    in the first rear bracket brace position, the second tooled connection bracket is proximate to a rear portion of the bracket support member in order to support the information handling system in a tooled configuration;
    in the second rear bracket brace position, the second toolless connection bracket is proximate to the rear portion of the bracket support member in order to support the information handling system in a toolless configuration; and
    in both the first and second rear bracket brace positions, the rear bracket base is slidably adjustable relative to the bracket support member.

10. The system of claim 9, wherein in the second rear bracket brace position the second tooled connection bracket is proximate to a center portion of the bracket support member in order to support the information handling system in a two-post center-mounted configuration.

11. The system of claim 9, wherein at least one of the first and second toolless connection brackets is adjustably coupled to the bracket support member, such that the distance between the first and second toolless connection brackets is variable.

12. The system of claim 9, wherein at least one of the first and second tooled connection brackets is adjustably coupled to the bracket support member, such that the distance between the first and second tooled connection brackets is variable.

13. The system of claim 9, further comprising a front bracket base adjustably coupled to the bracket support member, the front bracket base including the first toolless connection bracket and the first tooled connection bracket and configured to be adjustably positioned in either a first front bracket brace position or a second front bracket brace position, wherein:
  in the first front bracket brace position, the first tooled connection bracket is proximate to a front portion of the bracket support member in order to support the information handling system in a tooled configuration;
  in the second front bracket brace position, the first toolless connection bracket is proximate to the front portion of the bracket support member in order to support the information handling system in a toolless configuration; and
  the second front bracket brace position is rotated 180 degrees from the first front bracket brace position relative to the bracket support member.

14. The system of claim 9, further comprising:
a third tooled connection bracket adjustably coupled to the bracket support member; and
a fourth tooled connection bracket coupled to the bracket support member, wherein:
  the third and fourth tooled connection brackets are configured to couple to opposite sides of a post of a two-post rack; and
  the rail is adjustable to position the third and fourth tooled connection brackets proximate to a center portion of the bracket support member in order to support the information handling system in a two-post center-mounted tooled configuration.

15. The system of claim 9, further comprising a third tooled connection bracket adjustably coupled to the bracket support member, wherein:
  the third tooled connection bracket and an at least one of the first and second tooled connection brackets are configured to couple to opposite sides of a post of a two-post rack; and
  the rail is adjustable to position the third tooled connection bracket and the at least one of the first and second tooled connection brackets proximat to a front portion of the bracket support member in order to support the information handling system in a two-pos-flush-mounted tooled configuration.

16. The system of claim 9, wherein the first toolless connection bracket comprises at least two projections for projecting into at least two openings of a rack post, each projection comprising:
  a first portion with a rounded cross-section; and
  a second portion with a substantially rectangular cross-section, such that the projection is configured to be received in both a rounded opening and a substantially rectangular opening.

* * * * *